United States Patent
Wang

(10) Patent No.: US 11,558,054 B1
(45) Date of Patent: Jan. 17, 2023

(54) ACTIVE GATE DRIVING SIGNAL OPTIMIZATION

(71) Applicant: Kabushiki Kaisha Toshiba, Tokyo (JP)

(72) Inventor: Xiang Wang, Bristol (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 17/454,860

(22) Filed: Nov. 15, 2021

(51) Int. Cl.
| | |
|---|---|
| H03K 17/00 | (2006.01) |
| H03K 19/003 | (2006.01) |
| H03K 17/18 | (2006.01) |
| H03K 17/16 | (2006.01) |
| H02M 1/08 | (2006.01) |
| H03K 17/06 | (2006.01) |

(52) U.S. Cl.
CPC ........ H03K 19/00361 (2013.01); H02M 1/08 (2013.01); H03K 17/06 (2013.01); H03K 17/163 (2013.01); H03K 17/18 (2013.01)

(58) Field of Classification Search
None
See application file for complete search history.

(56) References Cited

U.S. PATENT DOCUMENTS

| | | | | |
|---|---|---|---|---|
| 5,828,247 | A * | 10/1998 | Moller | H03K 17/18 327/388 |
| 10,790,818 | B1 * | 9/2020 | Frank | H03K 17/168 |
| 2021/0297022 | A1 * | 9/2021 | Watkins | H02P 7/29 |

OTHER PUBLICATIONS

Dymond et al., "A 6.7-GHz Active Gate Driver for GaN FETs to Combat Overshoot, Ringing, and EMI", IEEE Transactions on Power Electronics, vol. 33, No. 1, pp. 581-594, Jan. 2018, doi: 10.1109/TPEL.2017.2669879.
Shorten et al., "A Segmented Gate Driver IC for the Reduction of IGBT Collector Current Over-Shoot at Turn-On", 2013 25th International Symposium on Power Semiconductor Devices & IC's (ISPSD), 2013, pp. 73-76, doi: 10.1109/ISPSD.2013.6694400.

* cited by examiner

*Primary Examiner* — Tuan T Lam
(74) *Attorney, Agent, or Firm* — Oblon, McClelland, Maier & Neustadt, L.L.P.

(57) ABSTRACT

A method for controlling an electrical switch using a driver waveform, wherein the driver waveform comprises: a first time period, $T_1$, associated with a first current, $I_{G\_high}$; a second time period, $T_2$, associated with a second current, $I_{G\_low}$; wherein: the first current of the driver waveform, $I_{G\_high}$, is larger than the second current of the driver waveform, $I_{G\_low}$; and the first time period, $T_1$, has a first duration and the second time period, $T_2$, has a second duration. The method comprising: determining an optimised first duration by repeatedly modifying the first duration until an overshoot in an output waveform generated by switching the electrical switch using the driver waveform is less than a threshold; determining an optimised second duration based on the optimised first duration; and switching the electrical switch using the optimised first duration and the optimised second duration.

20 Claims, 8 Drawing Sheets

(a)

(b)

(c)

(d)

(e)

ACTIVE GATE DRIVING SIGNAL OPTIMIZATION

FIELD

Embodiments described herein relate generally to a method and device for controlling an electrical switch using a driver waveform.

BACKGROUND

Brushless DC (BLDC) motors have been used in a number of applications including: electric vehicles, industrial cooling and consumer electronics. Windings of the Brushless DC (BLDC) motor can be controlled using an Electrical Switch (ES) such as a MOSFET (Metal-Oxide-Semiconductor Field-Effect Transistor) or an IGBT (Insulated-Gate Bipolar Transistor). A Gate Driver (GD) is an electronic circuit that is used to drive (i.e. control the behaviour of) the Electric Switch (ES).

The switching waveform used to control the Electrical Switch (ES) can affect the electrical performance of the Electrical Switch (ES). Known Gate Drivers apply a sharp pulse waveform (e.g. a step waveform) to control the state (e.g. on/off) of the Electrical Switch (ES). Sharp pulse gate driving waveforms can reduce switching losses. However, sharp pulse driving waveforms can also generate high levels of Electromagnetic Interference (EMI), which can break Electromagnetic Compatibility (EMC) regulations.

The amount of electromagnetic interference generated by the system can be reduced by shielding the system in a metal layer. Increasing the amount of metal shielding can reduce an amount of electromagnetic interference generated for the sharp pulse waveform. However, this approach is expensive and increases the weight of the system.

Another approach is to use an Active Gate Driver (AGD). An Active Gate Driver (AGD) is configured to shape the voltage/current waveform applied to the gate of the switching device in order to improve switching characteristics and provide flexibility on the switching transient. However, only a few waveforms are known to improve performance and these waveforms are generated for a specific set of operating conditions (e.g. for a specific drain current). As a result, any changes to the operating conditions (e.g. changes to the drain current) can reduce the effectiveness of these specifically designed waveforms. In light of this, there is a need for a new approach to generating gate driving waveforms.

Arrangements of embodiments will be understood and appreciated more fully from the following detailed description, made by way of example only and taken in conjunction with drawings in which.

DETAILED DESCRIPTION

Figure 1A:
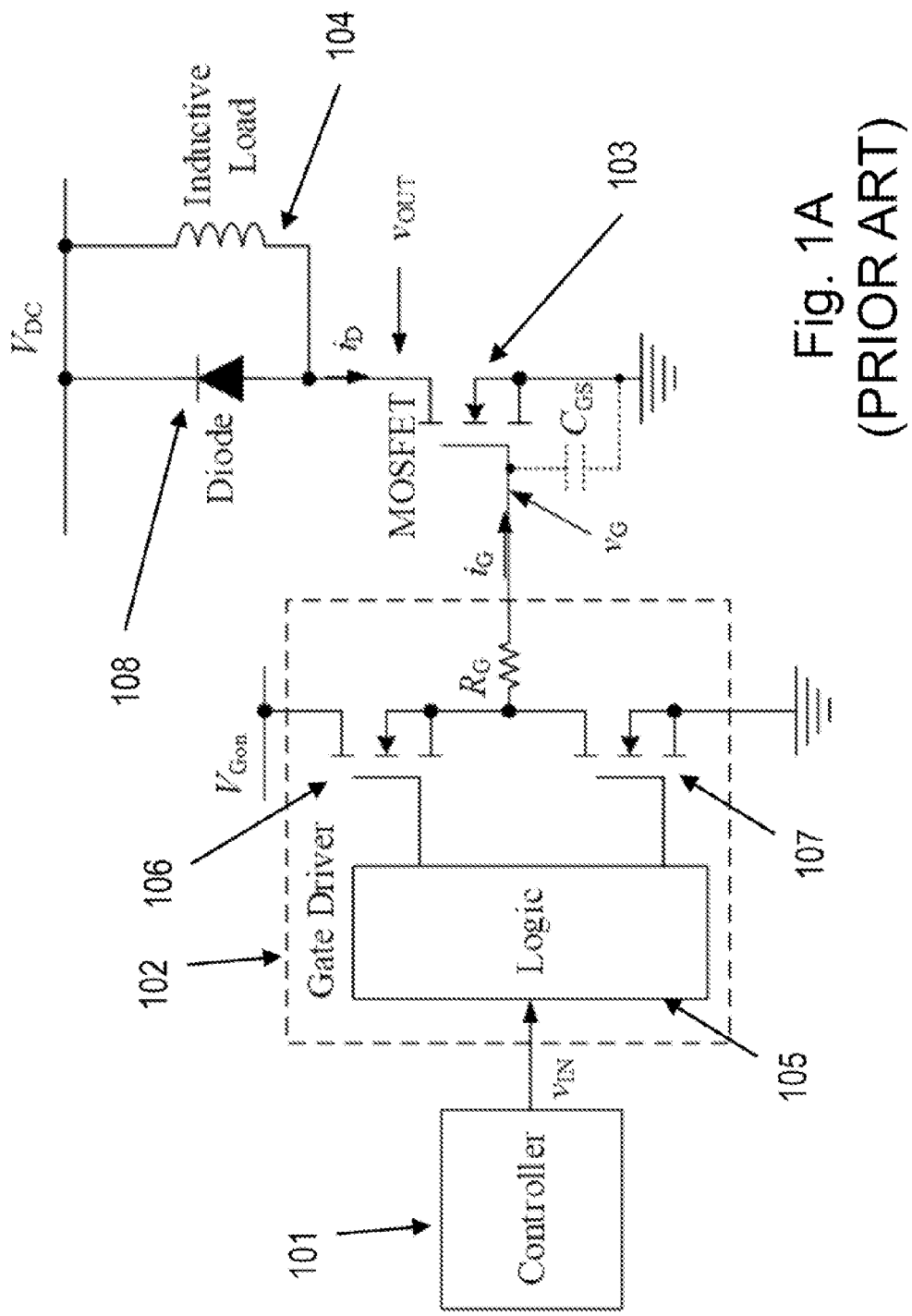
FIG. 1A shows a known electronic system.

According to a first aspect there is provided a method for controlling an electrical switch using a driver waveform, wherein the driver waveform comprises: a first time period, $T_1$, associated with a first current of the driver waveform, $I_{G\_high}$; a second time period, $T_2$, associated with a second current of the driver waveform, $I_{G\_low}$; wherein: the first current of the driver waveform, $I_{G\_high}$, is larger than the second current of the driver waveform, $I_{G\_low}$, and the first time period, $T_1$, has a first duration and the second time period, $T_2$, has a second duration. The method comprising: determining an optimised first duration by repeatedly modifying the first duration until an overshoot in an output waveform generated by switching the electrical switch using the driver waveform is less than a threshold; determining an optimised second duration based on the optimised first duration; and switching the electrical switch using the driver waveform, wherein the first duration equals the optimised first duration and the second duration equals the optimised second duration. In an embodiment controlling an electrical switch using a driver waveform comprises switching the electrical switch using the driver waveform.

Optionally, switching the electrical switch using the driver waveform comprises applying the driver waveform to a gate of the electrical switch.

In an embodiment the output waveform is a current waveform, the current waveform is the drain current while the driver waveform is applied to the electrical switch.

In an embodiment the output waveform is a voltage waveform, the voltage waveform is the drain-source voltage while the driver waveform is applied to the electrical switch.

In an embodiment the threshold is predetermined.

In an embodiment an optimised first duration is a fourth duration, an optimised second duration is a fifth duration.

In an embodiment repeatedly modifying the first duration until an overshoot in an output waveform generated by switching the electrical switch using the driver waveform is less than a threshold comprises: switching the electrical switch using a first driver waveform; measuring the overshoot in the output waveform generated by switching the electrical switch; determining if the overshoot is less than a threshold; and in response to determining that the overshoot is not less than the threshold: changing a value of the first duration to generate a second driver waveform; switching the electrical switch using the second driver waveform.

In an embodiment the method further comprises setting a starting point for the first duration before repeatedly modifying the first duration by: setting the second duration equal to zero, such that the driver waveform is associated with the first current, $I_{G\_high}$, for a whole switching period; applying the driver waveform to the electrical switch; determining a time to overshoot, $t_{overshoot}$, based on a time difference between: 1) a time when the driver waveform is first applied to the electrical switch, $t_0$, and 2) observing a maximum overshoot in the output waveform associated with the electrical switch; setting the first duration equal to the time to overshoot, $t_{overshoot}$; and setting the second duration equal to a maximum turn-on time, $T_{max}$.

In an embodiment the whole switching period is predetermined based on a characteristic of the MOSFET. Optionally, the characteristic is the total gate charge.

In an embodiment the whole switching period $$= \frac{Q_g}{I_{G\_high}}.$$

Optionally, where the waveform has a $T_3$, $T_3$ equals the whole switching period. Optionally, where the waveform has no $T_3$, $T_1$ equals the whole switching period. In an embodiment whole switching period=$t_1-t_0$.

In an embodiment the method further comprises setting the first duration equal to zero.

In an embodiment the maximum turn-on time is predetermined. Optionally, the maximum turn on time, $T_{max}$, equals 100 nanoseconds.

In an embodiment the maximum overshoot in the output waveform occurs when a maximum value of the drain current in the drain current waveform occurs.

In an embodiment repeatedly modifying the first duration comprises: adjusting a value of the first duration; switching the electrical switch using the driver waveform; and measuring the overshoot in the output waveform generated by switching the electrical switch.

In an embodiment adjusting the value of the first duration comprises reducing the value of the first duration by a time step. Optionally, the time step equals 2 ns.

In an embodiment determining the optimised second duration comprises: determining a time to overshoot, $t_{overshoot}$, based on a difference between: 1) a time when the driver waveform is first applied to the electrical switch, $t_0$; and 2) observing a maximum overshoot in the output waveform associated with the electrical switch; and generating the optimised second duration based on a difference between the time to overshoot, $t_{overshoot}$, and the optimised first duration.

In an embodiment $T_2=T_{overshoot}-T_1$.

In an embodiment the maximum overshoot in the output waveform occurs when a maximum value of the drain current in the drain current waveform occurs.

In an embodiment the driver waveform further comprises: a third time period, $T_3$, associated with the first current, $I_{G\_high}$, of the driver waveform wherein the third time period, $T_3$, has a third duration, and the method further comprises: determining an optimised third duration based on the optimised first duration and the optimised second duration; and switching the electrical switch using the driver waveform wherein the third duration equals the optimised third duration.

In an embodiment the sum of the first time period, the second time period and the third time period equals a time period of the switching transient.

In an embodiment the optimised third duration is a sixth duration.

In an embodiment determining the optimised third duration comprises: calculating a first charge injected during the first time period; calculating a second charge injected during the second time period; determining a remaining charge to be injected based on a difference between a total gate charge and a sum of: the first charge injected and the second charge injected; and calculating the optimised third duration based on the remaining charge to be injected divided by the first current.

In an embodiment the third time period is calculated according to:

$$T_3 = \frac{Q_g - I_{G\_high} \times T_1 + I_{G\_low} \times T_2}{I_{G\_high}}$$

In an embodiment the output waveform is a current waveform.

In an embodiment the electrical switch is a MOSFET.

In an embodiment the output waveform is a drain current waveform comprising information identifying a drain current of the MOSFET.

In an embodiment measuring the overshoot in the current waveform comprises: measuring a current associated with the electrical switch while switching the electrical switch using the driver waveform; determining a maximum value of the current; determining a steady state value of the current; and calculating the overshoot in the current waveform based on a difference between the maximum value of the current and the steady state value of the current.

In an embodiment the steady state value of the current, is the current value once the switching behaviour settles.

According to a second aspect there is provided a device for controlling an electrical switch using a driver waveform, wherein the driver waveform comprises: a first time period, $T_1$, associated with a first current of the driver waveform, $I_{G\_high}$; a second time period, $T_2$, associated with a second current of the driver waveform, $I_{G\_low}$; wherein: the first current of the driver waveform, $I_{G\_high}$, is larger than the second current of the driver waveform, $I_{G\_low}$, and the first time period, $T_1$, has a first duration and the second time period, $T_2$, has a second duration. The device configured to: determine an optimised first duration by repeatedly modifying the first duration until an overshoot in an output waveform generated by switching the electrical switch using the driver waveform is less than a threshold; determine an optimised second duration based on the optimised first duration; and switch the electrical switch using the driver waveform, wherein the first duration equals the optimised first duration and the second duration equals the optimised second duration.

In an embodiment the device is further configured to set a starting point for the first duration before repeatedly modifying the first duration by: setting the second duration equal to zero, such that the driver waveform is associated with the first current, $I_{G\_high}$, for a whole switching period; applying the driver waveform to the electrical switch; determining a time to overshoot, $t_{overshoot}$, based on a time difference between: 1) a time when the driver waveform is first applied to the electrical switch, $t_0$, and 2) observing a maximum overshoot in the output waveform associated with the electrical switch; setting the first duration equal to the time to overshoot, $t_{overshoot}$; and setting the second duration equal to a maximum turn-on time, $T_{max}$.

In an embodiment the device is further configured, when repeatedly modifying the first duration, to: adjust a value of the first duration; switch the electrical switch using the driver waveform; and measure the overshoot in the output waveform generated by switching the electrical switch. In an embodiment the device is further configured, when adjusting the value of the first duration, to: reduce the value of the first duration by a time step.

In an embodiment the device is further configured, when determining the optimised second duration, to: determine a time to overshoot, $t_{overshoot}$, based on a difference between: 1) a time when the driver waveform is first applied to the electrical switch, $t_0$; and 2) observing a maximum overshoot in the output waveform associated with the electrical switch;

and generate the optimised second duration based on a difference between the time to overshoot, $t_{overshoot}$, and the optimised first duration.

In an embodiment the driver waveform further comprises: a third time period, $T_3$, associated with the first current, $I_{G\_high}$, of the driver waveform wherein the third time period, $T_3$, has a third duration, and the device is further configured to: determine an optimised third duration based on the optimised first duration and the optimised second duration; and switch the electrical switch using the driver waveform wherein the third duration equals the optimised third duration.

In an embodiment the device is further configured, when determining the optimised third duration, to: calculate a first charge injected during the first time period; calculate a second charge injected during the second time period; determine a remaining charge to be injected based on a difference between a total gate charge and a sum of: the first charge injected and the second charge injected; and calculate the optimised third duration based on the remaining charge to be injected divided by the first current.

In an embodiment the output waveform is a current waveform.

In an embodiment the electrical switch is a MOSFET.

In an embodiment the output waveform is a drain current waveform comprising information identifying a drain current of the MOSFET.

In an embodiment the device is further configured, when measuring the overshoot in the current waveform, to: measure a current associated with the electrical switch while switching the electrical switch using the driver waveform; determine a maximum value of the current; determine a steady state value of the current; calculate the overshoot in the current waveform based on a difference between the maximum value of the current and the steady state value of the current.

According to a third aspect there is provided a non-transitory computer-readable medium comprising computer program instructions suitable for execution by a processor, the instructions configured, when executed by the processor, to: control an electrical switch using a driver waveform, wherein the driver waveform comprises: a first time period, $T_1$, associated with a first current of the driver waveform, $I_{G\_high}$; a second time period, $T_2$, associated with a second current of the driver waveform, $I_{G\_low}$; wherein: the first current of the driver waveform, $I_{G\_low}$, is larger than the second current of the driver waveform, $I_{G\_high}$, and the first time period, $T_1$, has a first duration and the second time period, $T_2$, has a second duration. The instructions further configured, when executed by the processor to: determine an optimised first duration by repeatedly modifying the first duration until an overshoot in an output waveform generated by switching the electrical switch using the driver waveform is less than a threshold; determine an optimised second duration based on the optimised first duration; and switch the electrical switch using the driver waveform, wherein the first duration equals the optimised first duration and the second duration equals the optimised second duration.

According to a fourth aspect there is provided a system comprising: a device as discussed above; an active gate driver comprising an input coupled to an output of the device; and an electrical switch comprising a first input coupled to a first output of the active gate driver; wherein: the device is further configured output information identifying the driver waveform; the active gate driver is configured to output a switching waveform based on the information identifying the driver waveform; and the electrical switch is configured to control the output waveform based on the switching waveform applied to the first input of the electrical switch.

In an embodiment the system further comprises a sensor configured to sample the output waveform, wherein the sensor comprises a second output coupled to the device.

FIG. 1A shows a known electronic system. In particular FIG. 1A shows an electronic system comprising a controller 101, a Gate Driver (GD) 102, an Electrical Switch (ES) 103 in the form of a MOSFET, optionally an N-channel MOSFET and an inductive load 104. An output of the controller 101 is electrically coupled to an input of the Gate Driver (GD) 102. The controller 101 is configured to generate an input voltage signal, $v_{IN}$, indicating a desired state of the Electrical Switch (ES) 103. In an example, a low input voltage (e.g. 0V) is associated with an 'off' state of the Electrical Switch (ES) and a high input voltage (e.g. 5V) is associated with an 'on' state of the Electrical Switch (ES).

The Gate Driver (GD) 102 is configured to receive the input voltage, $v_{IN}$, and convert the input voltage signal into a gate driving waveform, $v_G$, for controlling the behaviour of the Electrical Switch (ES) 103. An Output of the Gate Driver (GD) 102 is electrically coupled to the gate of the Electrical Switch (ES) 103. In FIG. 1A the Gate Driver (GD) 102 comprises a logic component 105, a first MOSFET 106 and a second MOSFET 107. In FIG. 1A, the Gate Driver (GD) 102 is configured to switch the gate driving waveform, $v_G$, between an on-state voltage, $V_{Gon}$, (in which the first MOSFET 106 is 'on' and the second MOSFET 107 is 'off') and ground (in which the first MOSFET 106 is 'off' and the second MOSFET 107 is 'on'). The logic component 105 is configured to control the first MOSFET 106 and the second MOSFET 107 according to the input voltage, $v_{IN}$.

In an example the Electrical Switch (ES) 103 is a MOSFET comprising a gate, a drain and a source. In FIG. 1A the gate is electrically connected to an output of the Gate Driver (GD) 102. The source is connected to ground and the drain is coupled to a second terminal of the inductive load 104. The first terminal of the inductive load 104 is coupled to a supply voltage, $V_{DC}$. In an example, the inductive load 104 represents a motor winding of a Brushless DC (BLDC) Motor.

Optionally, the electronic system comprises a flyback diode 108 to reduce the occurrence of sudden voltage spikes across the inductive load 104 when the supply current is suddenly reduced or interrupted. In FIG. 1A the anode of the flyback diode 108 is coupled to the drain of the MOSFET and the cathode of the flyback diode 108 is coupled to the supply voltage, $V_{DC}$.

In FIG. 1A the gate driving waveform, $v_G$, takes two values. The first value being ground which switches the Electrical Switch (ES) 103 'off'. The second value being the on-state voltage, $V_{Gon}$, which switches the Electrical Switch (ES) 103 'on'.

The Electronic Switch (ES) 103 is likely a physically large device, especially when used in power-electronics applications such as motor control. As a result, there will likely be a large capacitance between the gate and the source terminals of the Electrical Switch (ES) 103. This capacitance is referred to as the Gate-Source capacitance, $C_{GS}$.

When the gate driving waveform, $v_G$, is driven above ground (i.e. when the first MOSFET 106 is turned on) a gate current, $i_G$, flows into the gate of the MOSFET. The current is limited by a gate resistance, $R_G$, which determines the switching speed of the MOSFET. When the gate driving waveform, $v_G$, reaches a certain threshold (e.g. $V_{GS(threshold)}$), the MOSFET turns-on, causing a large drain current, $i_D$, to flow and the output voltage, $v_{OUT}$, to drop.

Figure 1B:
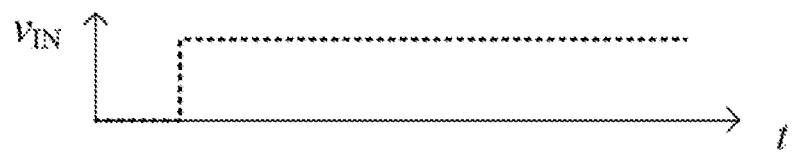
FIG. 1B shows example waveforms of an electronic system.
Figure 1B:
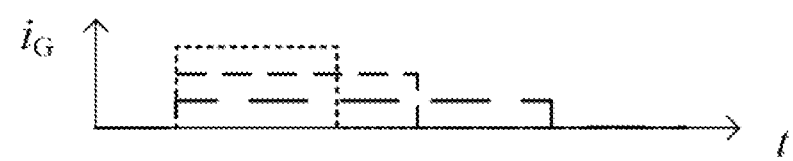
Figure 1B:
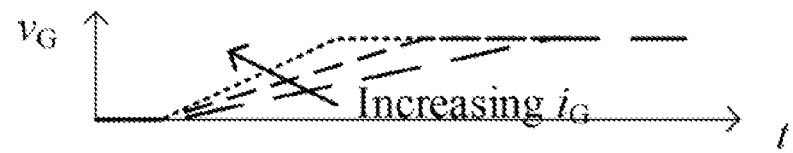
Figure 1B:
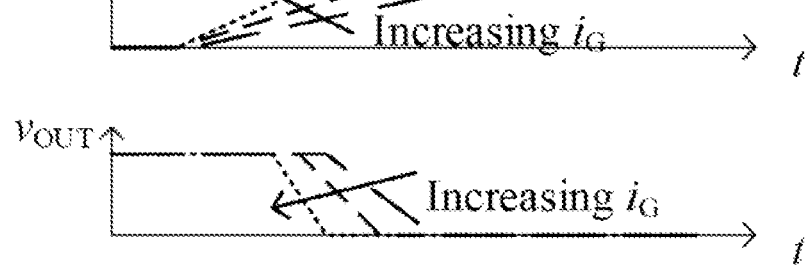
Figure 1B:
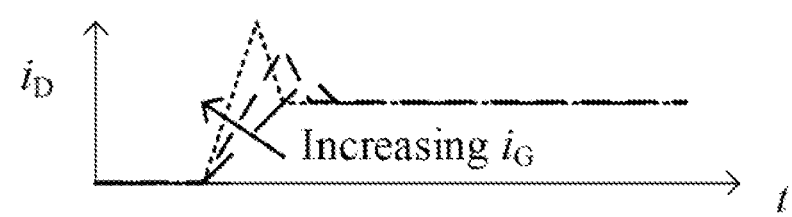

FIG. 1B shows example waveforms of an electronic system. In particular FIG. 1B shows, in graph (a), the controller 101 outputting an input voltage, $v_{IN}$, in the shape of a step function thereby indicating that the Electrical Switch (ES) 103 is to change states from an off-state to an on-state. The step function input voltage, $v_{IN}$, is received by the Gate Driver (GD) 102. In response to receiving the step function input voltage, $v_{IN}$, the Gate Driver (GD) 102 connects the gate of the Electrical Switch (ES) 103 to the on-state voltage, $V_{Gon}$, (e.g. by turning the first MOSFET 106 'on' and turning the second MOSFET 107 'off').

A gate current, $i_G$, subsequently flows with a magnitude controlled by the gate resistance, $R_G$, as shown in graph (b). It takes a finite time for the gate voltage, $v_G$, to rise depending on the available gate current, $i_G$, as shown in graph (c). A higher gate current, $i_G$, results in a shorter time for the gate voltage, $v_G$, to rise. Due to the limited gate current, $i_G$, it will take a finite time for the Electrical Switch (ES) to turn on. As a result, it will take a finite time for the output voltage, $v_{OUT}$, to drop, as shown in graph (d) and it will take a finite time for the drain current, $i_D$, to rise, as shown in graph (e).

Energy is dissipated by the Electrical Switch (ES) 103 when there is an overlap between the drain-source voltage, $v_{DS}$, waveform (which, in FIG. 1A is equivalent to the output voltage, $v_{OUT}$) and the drain-source current, $i_{DS}$, waveform (which, in FIG. 1A is equivalent to the drain current, $i_D$). Consequently, a finite fall time for the output voltage, $v_{OUT}$, and a finite rise time for the drain current, $i_D$, results in energy dissipation by the Electrical Switch (ES) 103 and a loss in efficiency.

Ideally the output voltage, $v_{OUT}$, should drop quickly for maximum efficiency. However a quick drop in the output voltage, $v_{OUT}$, will result in ringing (otherwise referred to as 'overshoot') on the drain current, $i_D$, as shown in graph (e). The greater the gate current, $i_G$, the faster the Electrical Switch (ES) 103 switches on, the faster the output voltage, $v_{OUT}$, drops (therefore the less power loss and the better efficiency) but the larger the amplitude of ringing on the drain current, $i_D$, (which can cause damage to components of the electronic system and result in greater electromagnetic interference). For this reason the Gate Driver (GD) of FIG. 1A cannot simultaneously achieve high efficiency and remain EMC compliant.

In an example an Active Gate Driver (AGD) is provided where a customisable waveform is used to drive the gate of the Electrical Switch (ES). In this way an optimum waveform that balances minimising the ringing in the drain current, $i_D$, with minimising the switching losses (and therefore maximising the efficiency) can be used to control the Electrical Switch (ES).

Figure 2:
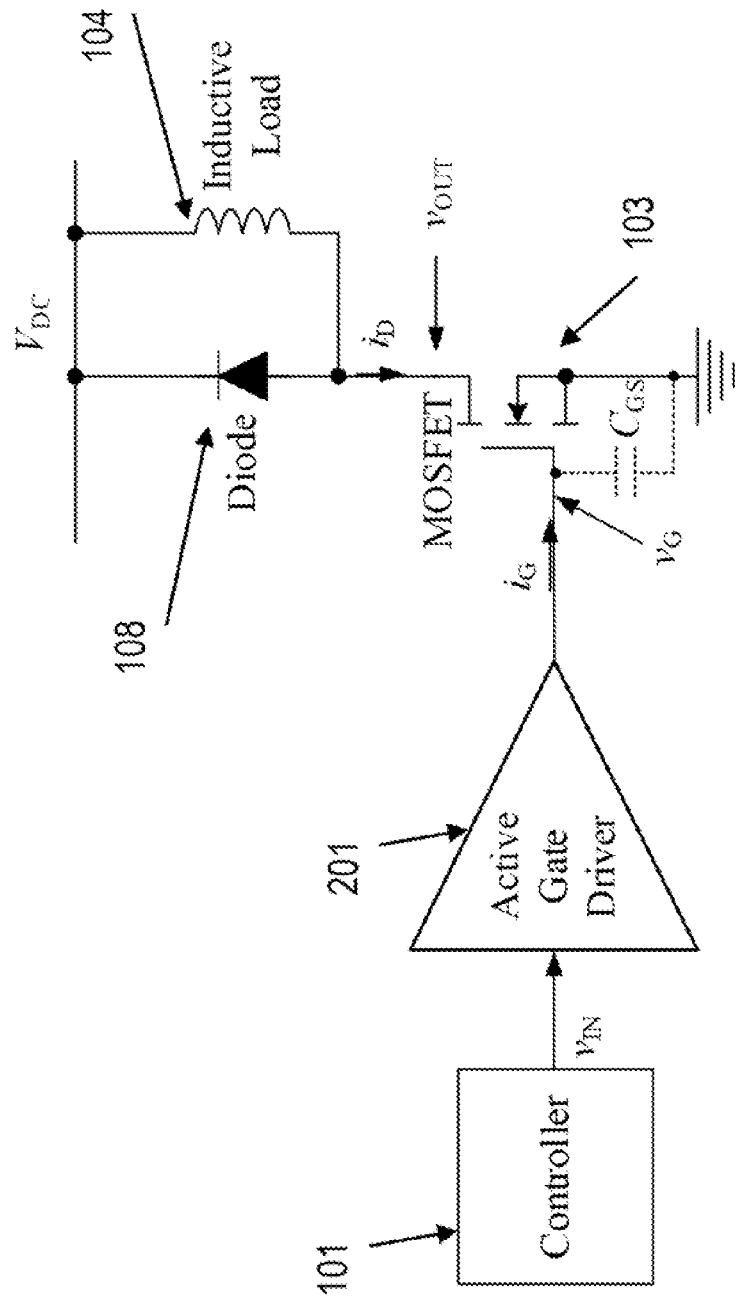
FIG. 2 shows a known electronic system comprising an Active Gate Driver (AGD)

FIG. 2 shows a known electronic system comprising an Active Gate Driver (AGD). FIG. 2 uses the same reference numerals as FIG. 1A to denote same components. The system shown in FIG. 2 also comprises an Active Gate Driver (AGD) 201. The Active Gate Driver 201 is configured to generate a custom gate driver waveform, $v_G$, (i.e. the Active Gate Driver 201 is configured to apply a specified sequence of voltages to the Gate of the Electrical Switch (ES) 103). Using an Active Gate Driver (AGD) 201 provides more control and flexibility over the gate driver waveform, $v_G$, and can be used to achieve both low energy losses and low levels of ringing.

That being said, finding an optimum gate driving waveform can be challenging and often requires complex calculation. In particular, gate driving waveforms are usually designed as a manual process and make use of complex shapes. Furthermore, the ability of a gate driving signal to minimise the switching loss and/or the amount of overshoot is heavily influenced by the Drain current, $i_D$. Once the Drain current, $i_D$, changes, the gate driving waveform is required to change accordingly. However, the limited number of pre-designed waveforms and the complexity associated with designing a new waveform makes it difficult to generate a new gate driving waveform. As a result, a sub-optimal switching waveform can often end up being used by the Active Gate Driver (AGD) 201, introducing extra losses and larger overshoots. In light of this, there is a need for an improved Active Gate Driver (AGD) and an improved method of optimising the gate driver waveform.

Figure 3A:
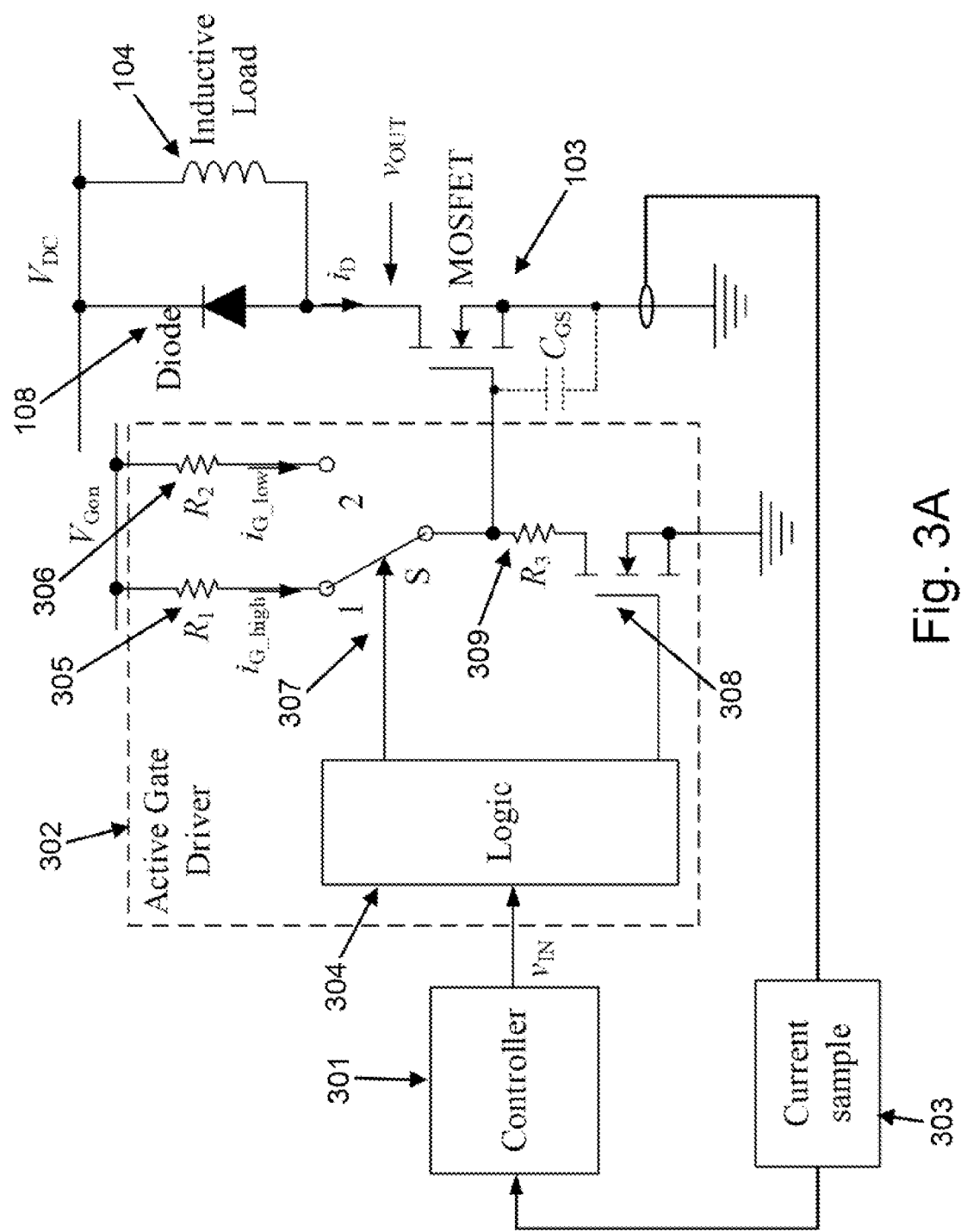
FIG. 3A shows an electronic system comprising an Active Gate Driver (AGD) according to an example.

FIG. 3A shows an electronic system comprising an Active Gate Driver (AGD) according to an example. Same reference numerals are used in FIG. 3A as were used in FIG. 1A to denote same components. The system show in FIG. 3A further comprises a controller 301, an Active Gate Driver (AGD) 302 and a current sensor 303.

The current sensor 303 is communicatively coupled to the controller 301 and is configured to measure the drain current, $i_D$, (which, in FIG. 3A, is equivalent to the Drain-Source current, $i_{DS}$, thereby allowing the sensor to be placed at the Source of the MOSFET). The current sensor 303 is configured to sample the drain current, $i_D$, and provide these samples to the controller 301 in order to generate a drain current waveform.

The controller 301 is configured to implement the optimisation methods discussed below. The controller 301 is further configured to output an input voltage, $v_{in}$, to the Active Gate Driver (AGD) 302 in order to control a gate current, $i_G$, outputted by the Active Gate Driver (AGD) 302.

The Active Gate Driver 302 is configured to generate a plurality of gate currents. In the example of FIG. 3A the number of non-zero gate currents generated by the Active Gate Driver 302 is two. In particular, the Active Gate Driver 302 has two non-zero output current levels: a high gate current, $I_{G\_high}$, and a low gate current $I_{G\_low}$. The high gate current, $I_{G\_high}$, is a larger value of current than the low gate current, $I_{G\_low}$. The high gate current, $I_{G\_high}$, and the low gate current, $I_{G\_low}$, can take any value. In an example the switch 307 may be damaged if the current is too high. Optionally the high gate current, $I_{G\_high}$, is between 1 Amp and 5 Amps, and the low gate current, is between 10 milliamps and 100 milliamps. The Active Gate Driver 302 is configured to change which current level is outputted according to the input signal, $v_{in}$.

In an example, the Active Gate Driver 302 is implemented using a logic component 304, a first resistor 305, a second resistor 306, a switch 307 and a second Electrical Switch (ES) 308. The switch 307 is optionally a fast switch (i.e. a switch that can change state every 2 nanoseconds). The switch has a first input, a second input and an output. The first input of the switch 307 is coupled to the on-state voltage, $V_{Gon}$, via the first resistor 305. The second input of the switch 307 is coupled to the on-state voltage, $V_{Gon}$, via the second resistor 306. The first resistance 305 has a lower resistance (i.e. a lower value of resistance) than the second resistor 306.

In a first state, the switch 307 is in a first position and the gate of the Electrical Switch (ES) 103 is connected to the on-state voltage, $V_{Gon}$, via the first resistor 305. In this state a high gate current, $I_{G\_high}$, is generated.

In a second state, the switch 307 is in a second position and the gate of the Electrical Switch (ES) 103 is connected to the on-state voltage, $V_{Gon}$, via the second resistor 306 (which has a higher resistance than the first resistor 305). In this state a low gate current, $I_{G\_low}$, is generated. The low gate current, $I_{G\_low}$, is a lower value of current than the high gate current, $I_{G\_high}$.

In a third state, the switch 307 is in a third position and the gate of the Electrical Switch (ES) 103 is connected to neither the first input or the second input (i.e. the output of the switch 307 is not connected to the first input or the second input). When the switch 307 is in the third position, the switch 307 is in the 'off' position.

The Active Gate Driver (AGD) 302 also comprises the second Electrical Switch (ES) 308. In an example the second Electrical Switch (ES) 308 is a MOSFET, optionally an N-channel MOSFET. In this case the second Electrical Switch (ES) 308 comprises at least two states. In a first state (i.e. an 'on' state) a conductive channel is formed between the drain and the source of the second Electrical Switch (ES) 308. In a second state (i.e. an 'off' state) there is no conductive channel between the drain and the source of the second Electrical Switch (ES) 308. The gate of the second Electrical Switch (ES) 308 is connected to, and controlled by, the logic component 304. When the Electrical Switch (ES) 308 is configured in the 'on' state the second Electrical Switch (ES) 308 connects the gate of the Electrical Switch (ES) 103 to ground, optionally via a third resistor 309. Put in other words, when the second Electrical Switch (ES) 308 is 'on', the Electrical Switch (ES) 103 is 'off', by virtue of the gate of the Electrical Switch (ES) being tied to ground.

In this way, the output of the Active Gate Driver (AGD) 302 is configurable between three different output states. In a first output state (when the switch 307 is in the first position and the second Electrical Switch (ES) 308 is 'off') a high gate current, $I_{G\_high}$, is generated. In a second output state (when the switch 307 is in the second position and the second Electrical Switch (ES) 308 is 'off') a low gate current, $I_{G\_low}$, is generated. In a third output state (when the second Electrical Switch (ES) 308 is 'on', the switch 307 is 'off') the gate of the Electrical Switch (ES) 103 tied to ground. In effect providing the ability to configure the Active Gate Driver (AGD) 302 to output one of three different levels of gate current, $i_G$. The three different levels of gate current, $i_G$, including the high gate current, $I_{G\_high}$, the low gate current, $I_{G\_low}$, and no gate current (i.e. when the gate of the Electrical Switch (ES) 103 is tied to ground).

In an example the system of FIG. 3A is configured to generate a 3-step gate current waveform in order to improve the performance of the switching transient. The 3 steps being 3 time steps.

Figure 3B:
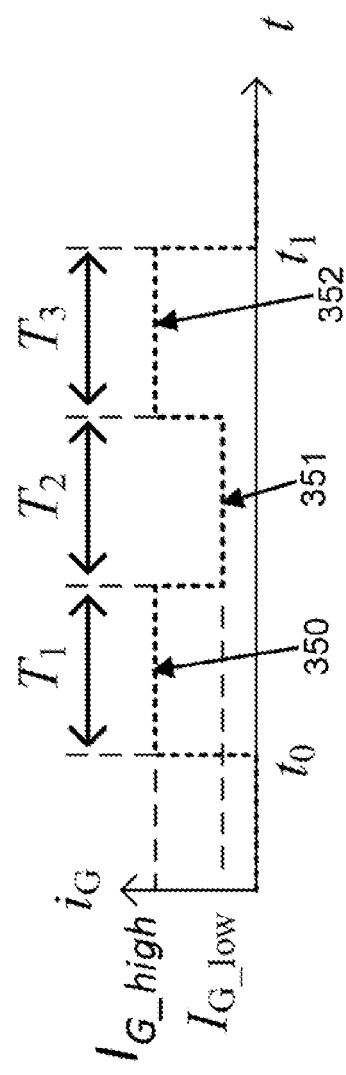
FIG. 3B shows a 3-Step gate current waveform according to an example.

FIG. 3B shows a 3-Step gate current waveform according to an example. In FIG. 3B the switching transient starts at a first time, $t_0$, when the high gate current, $I_{G\_high}$, is outputted by the Active Gate Driver (AGD) 302 and applied to the gate of the Electrical Switch (ES) 103. The gate current, $i_G$, is kept at the high gate current, $I_{G\_high}$, for a first time period, $T_1$, (i.e. a first duration of time).

After the first time period, $T_1$, has passed the gate current, $i_G$, is switched to the low gate current, $I_{G\_low}$, for a second time period, $T_2$ (i.e. a second duration of time). That is to say, after the first time period, $T_1$, has passed the output of the Active Gate Driver (AGD) 302 is switched to the low gate current, $I_{G\_low}$, for the second time period, $T_2$.

Optionally, after the second time period, $T_2$, has passed the gate current, $i_G$, is switched to the high gate current, $I_{G\_high}$. The gate current, $i_G$, is driven at the high Gate current, $I_{G\_high}$, for a third time period, $T_3$. The sum of the first time period, $T_1$, the second time period, $T_2$, and the third time period, $T_3$, equals a time period of the switching transient (which in FIG. 3B corresponds to $t_1$-$t_0$).

As known in the art, the Total Gate Charge ($Q_g$) is the amount of charge that needs to be injected into the gate electrode to completely turn on a MOSFET. The Total Gate Charge ($Q_g$) is an electrical characteristic of the MOSFET and can be found by measurement and/or by consulting a manufacturer's data sheet. The time period of the switching transient ($t_1$-$t_0$) represents the minimum amount of time that the switching waveform needs to be applied in order for the MOSFET to fully turn on. As will be discussed in more detail below, it has been found that the third time period, $T_3$, has minimal impact on the switching performance of the MOSFET (i.e. the overshoot/energy loss). Instead, the purpose of the third time period, $T_3$, is to inject charge into the gate electrode to reach the Total Gate Charge ($Q_g$) and fully turn on the MOSFET. Advantageously, by using a third time period, $T_3$, associated with the high gate current, $I_{G\_high}$, the Total Gate Charge ($Q_g$) is reached sooner. However, it is emphasised that the third time period, $T_3$, is optional, and the Total Gate Charge ($Q_g$) could instead be reached by extending the second time period, $T_2$ for longer.

It will be easily appreciated how the 3-step gate current waveform of FIG. 3B can be obtained using the Active Gate Driver (AGD) 302 of FIG. 3A. For example, during the first time period, $T_1$, when the high Gate current, $I_{G\_high}$, is outputted by the Active Gate Driver 302, the switch 307 is in the first position (i.e. connecting the gate of the Electrical Switch (ES) 103 to the on-state voltage, $V_{Gon}$, via the first resistor 305) and the second Electrical Switch (ES) 308 is 'off'.

During the second time period, $T_2$, when the low Gate current, $I_{G\_low}$, is outputted by the Active Gate Driver (AGD) 302, the switch 307 is in the second position (i.e. connecting the gate of the Electrical Switch (ES) 103 to the on-state voltage, $V_{Gon}$, via the second resistor 306).

During the third time period, $T_3$, the Active Gate Driver (AGD) 302 is configured in a similar way to the first time period, $T_1$. Optionally, outside of the time period of the switching transient (i.e. before $t_0$ and after $t_1$), the Active Gate Driver (AGD) 302 is configured to tie the gate of the Electrical Switch (ES) 103 to ground (e.g. by switching the second Electrical Switch (ES) 308 'on').

In an example the 3-step gate current waveform shown in FIG. 3B is generated by the Active Gate Driver (AGD) 302 in response to the receiving an input voltage signal from the controller 301. In an example the input voltage signal comprises three voltage levels (e.g. a first voltage level, a second voltage level, and a third voltage level) and the logic 304 is configured to cause the Active Gate Driver (AGD) 302 to: 1) output the high gate current, $I_{G\_high}$, when the input voltage, $v_{in}$, has the first voltage level, $v_1$; 2) output the low gate current, $I_{G\_low}$, when the input signal, $v_{in}$, has the second voltage level, $v_2$; and 3) tie the gate of the Electrical Switch (ES) 103 to ground when the input signal, $v_{in}$, has the third voltage level, $v_3$.

Figure 3C:
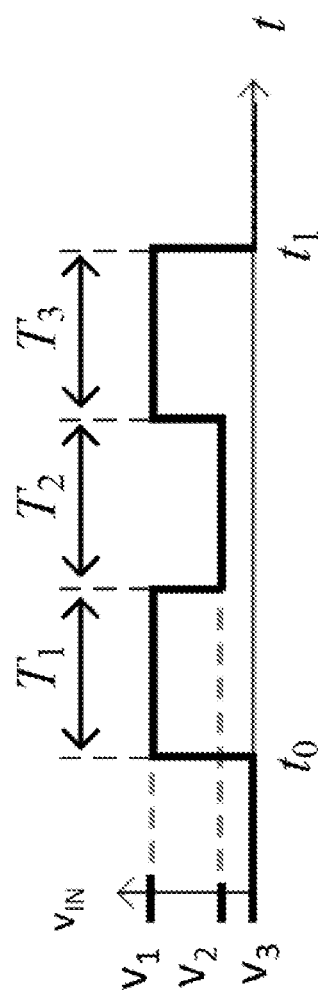
FIG. 3C shows an example of the input voltage signal outputted by the controller 301 to obtain the gate current waveform of FIG. 3B.

FIG. 3C shows an example of the input voltage signal outputted by the controller 301 to obtain the gate current waveform of FIG. 3B.

As discussed above, determining an optimum gate driver waveform can be challenging. In an example the controller 301 is configured to perform an optimisation method to generate an optimum gate driver waveform.

Figure 4A:
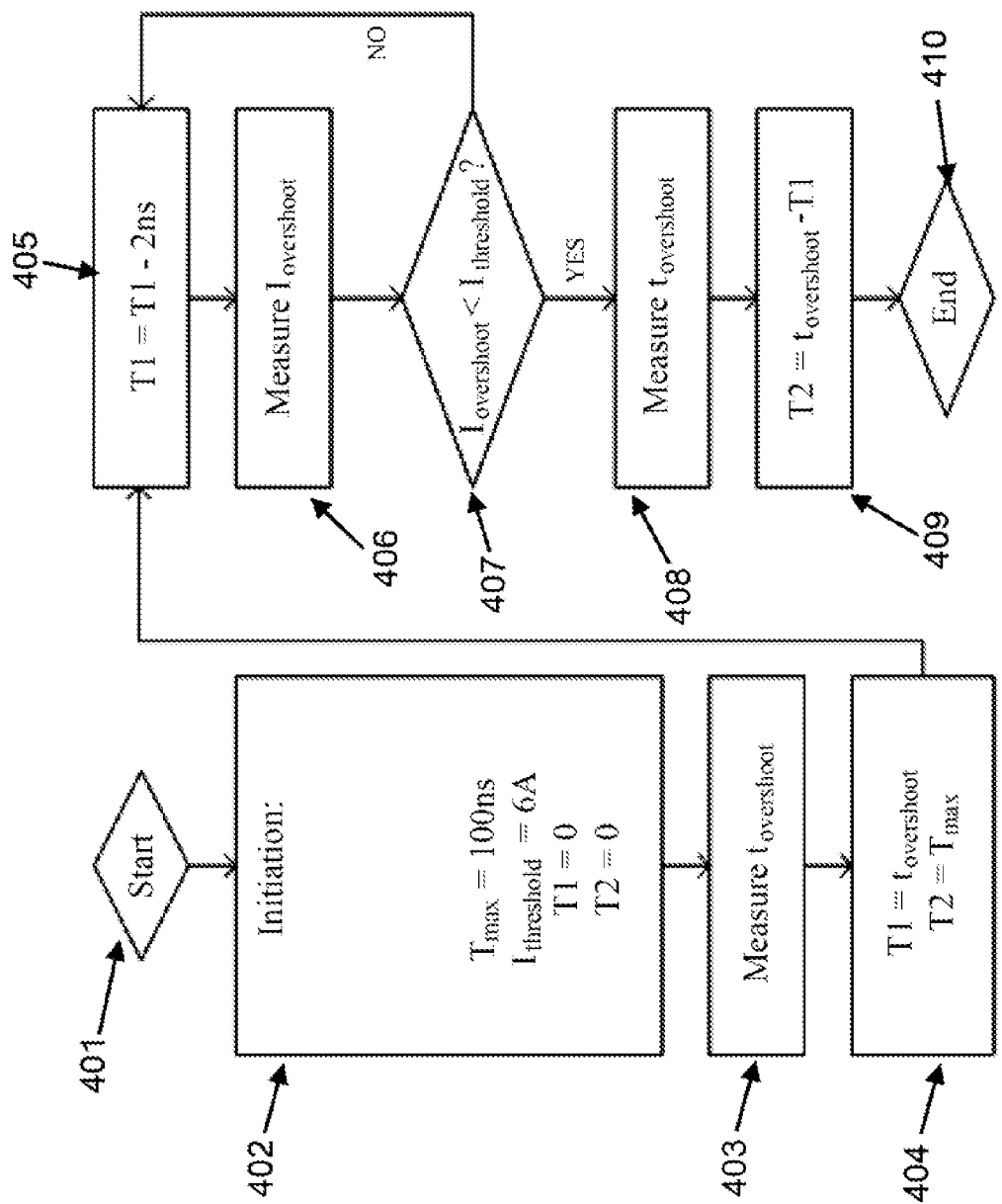
FIG. 4A shows a method of optimising a gate driver waveform according to an example.

FIG. 4A shows a method of optimising a gate driver waveform according to an example. In an example the method of FIG. 4A is performed by the controller 301. The controller 301 is configured to optimise a value (i.e. the duration) of the first time period, $T_1$, and the value of the second time period, $T_2$. Consequently, the value of the first time period, $T_1$, and the value of the second time period, $T_2$, can be regarded as parameters to be optimised. In an example the values of the first time period, $T_1$, and the second time period, $T_2$, are stored by the controller 301 for use in generating an optimised gate driving waveform.

As discussed above, the gate driver waveform optionally comprises a third time period, $T_3$, associated with high gate current, $I_{G\_high}$. In this case the controller 301 is also configured to calculate a value of the third period, $T_3$. The third time period, $T_3$, is a passive parameter that is calculated once the values of the first time period, $T_1$, and the second time period, $T_2$, have been determined. In an example, the value of the third time period, $T_3$, is calculated based on the total gate charge ($Q_g$) of the MOSFET 103. As discussed above, the purpose of the third time period, $T_3$, is to inject charge into the gate of the MOSFET so that the injected charge reaches a total gate charge ($Q_g$). When using the 3-step waveform of FIG. 3B, the gate charge, $Q_g = I_{G\_high} \times T_1 + I_{G\_low} \times T_2 + I_{G\_high} \times T_3$. The total gate charge ($Q_g$) is a known characteristic of the MOSFET being used and can be determined through measurement or from a manufacturer's data sheet. The value of the total gate charge ($Q_g$) for the Electrical Switch (ES) 103 is stored by the controller 301. Furthermore, the values of the high gate current, $I_{G\_high}$, and the low gate current, $I_{G\_low}$, are known by the controller 301 and are predetermined based on the component values of the first resistor 305 and the second resistor 306. Consequently, once the first time period, $T_1$, and the second time period, $T_2$, are known it is possible for the controller 301 to calculate a duration for the third time period, $T_3$, according to:

$$T_3 = \frac{Q_g - I_{G\_high} \times T_1 + I_{G\_low} \times T_2}{I_{G\_high}}$$

The method begins in step 401 and proceeds to step 402. In step 402 the values of the first time period, $T_1$, and the second time period, $T_2$, are initialised to 0 seconds.

The controller 301 is also configured to maintain and initialise two more parameters. The first of these parameters is the maximum turn-on time of the Electrical Switch (ES) 103, $T_{max}$ and the second of these parameters is the current threshold, $I_{threshold}$, which is the drain current overshoot limit (i.e. the maximum drain current that is to be obtained during a switching event).

The maximum turn-on time, $T_{max}$, and the current threshold, $I_{threshold}$, are predetermined and can take different values for different types/models of the Electrical Switch (ES) 103 and/or for different use-cases. In an example the values of the maximum turn-on time, $T_{max}$, and the current threshold, $I_{threshold}$, are determined from calibration tests. Optionally, the maximum turn-on time, $T_{max}$, is 100 nanoseconds (i.e. $T_{max}$=100 ns) and the current threshold, $I_{threshold}$, is 6 Amps (i.e. $I_{threshold}$=6 A). After initialising the parameters (i.e. after initialising: $T_1$, $T_2$, $T_{max}$, and $I_{threshold}$), the method proceeds to step 403.

In step 403 an "experiment" is conducted. More specifically, a gate driver waveform is generated that corresponds to the values of the parameters set in step 402. As discussed above, the parameters that directly control the shape of the gate drive waveform (see FIG. 3B) are the value of the first time period, $T_1$, (during which time a high gate current, $I_{G\_high}$, is outputted by the Active Gate Driver (AGD) 302), the value of the second time period, $T_2$, (during which time a low Gate current, $I_{G\_low}$, is outputted by the Active Gate Driver (AGD) 302) and the value of the of the third time period, $T_3$, (during which time a high gate current, $I_{G\_high}$, is outputted by the Active Gate Driver (AGD) 302). As a reminder, the third time, $T_3$, is a passive parameter in that it can be determined from the first time, $T_1$ and the second time, $T_2$.

In step 402 the value of the first time period, $T_1$, is set equal to zero and the value of the second time, $T_2$, is set equal to zero. The value of the third time period, $T_3$, is calculated according to the equation for $T_3$ discussed above, where the values $T_1$=0 and $T_2$=0 are used.

As discussed above, during the third time period, $T_3$, the gate current is the high gate current, $I_{G\_high}$ (i.e. during the third time period, $T_3$, the Active Gate Driver (AGD) 302 is configured to output the high gate current, $I_{G\_high}$). As a result, the waveform generated in step 403 comprises a gate driver waveform where the high gate current, $I_{G\_high}$, is applied to the gate of the Electrical Switch (ES) 103 for the whole time period of the switching transient.

The gate driver waveform (i.e. with $T_1$=0 and $T_2$=0) is subsequently outputted by the Active Gate Driver 302 and applied to the gate of the Electrical Switch (ES) 103 to control the switch.

During the switching event (i.e. while applying the gate drive waveform to the gate of the Electrical Switch (ES) 103), the drain current waveform is sampled. That is to say, while the gate drive waveform is applied to the gate of the Electrical Switch (ES) 103, the drain current, $i_D$, of the Electrical Switch (ES) is measured and recorded. In an example, the drain current, $i_D$, is observed by the controller 301 and the current sampler 303 (in particular by the controller 301 recording measurements obtained by the current sampler 303).

Finally, the interval between the start of switching and the time at which the maximum drain current is achieved (also referred to as the time to overshoot, $t_{overshoot}$) is calculated by the controller 301 from the observed drain current samples. The start of switching is the point in time when the controller 301 outputs a non-zero input voltage, $v_{in}$, to cause the Active Gate Driver (AGD) 302 to switch the Electrical Switch (ES) 103 (i.e. time to when the high gate current, $I_{G\_high}$, is applied to the gate of the Electrical Switch (ES) 103).

Figure 4B:
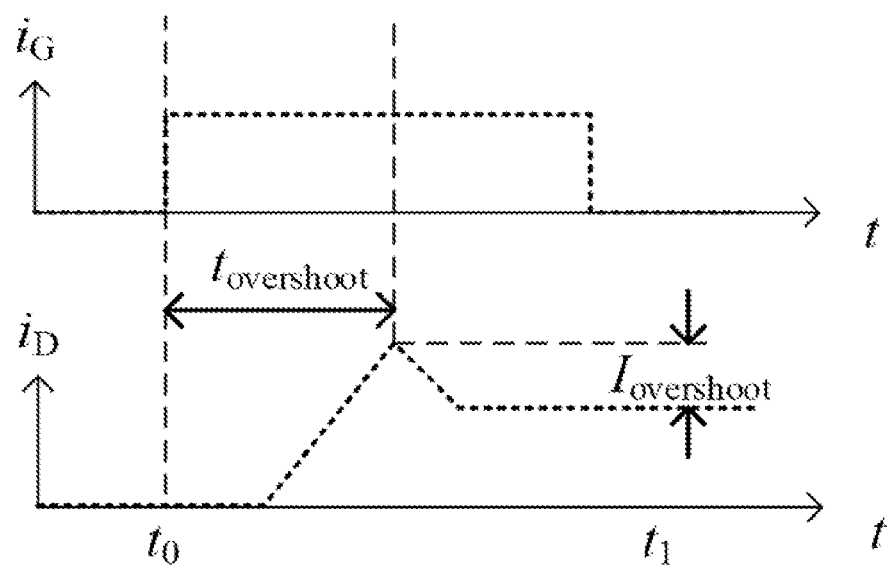
FIG. 4B shows current waveforms during a first experiment according to an example.

FIG. 4B shows current waveforms during a first experiment according to an example. In particular, FIG. 4B shows an example gate driver waveform where the gate current is the high gate current, $I_{G\_high}$, for the whole of the switching period (because in the first "experiment" the third time period, $T_3$, associated with the high gate current, $I_{G\_high}$, equals the whole time period of the switching transient).

FIG. 4B also shows the drain current waveform, $i_D$, during observed the switch (i.e. while applying the gate driving waveform to the Electrical Switch (ES) 103). As discussed above, the controller 301 is configured to observe the drain current, $i_D$, during the switching transient using the current sensor 303. In step 403 the controller 301 determines the time to overshoot, $t_{overshoot}$. The time to overshoot, $t_{overshoot}$, is the time difference (i.e. the duration of time between) the start of switching (i.e. $t_0$) until a maximum drain current value, $i_D$, is observed. After calculating the time to overshoot, $t_{overshoot}$, the method proceeds to step 404.

In step 404 the values of the values of the first time period, $T_1$, and the second time period, $T_2$, are updated in preparation for a second "experiment". In particular, the value of the first time period, $T_1$, is set equal to the time to overshoot, $t_{overshoot}$ (i.e. $t_1=t_{overshoot}$) and the value of the second time period, $T_2$, is set equal to the maximum turn on time of the MOSFET, $T_{max}$ (i.e. $T_2=T_{max}$). The value of the third time period, $T_3$, is subsequently calculated based on the updated value of the first time period, $T_1$, and the updated value of the second time period, $T_2$, using the equation discussed above. The method proceeds to step 405.

In step 405 the value of the first time period, $T_1$, is reduced by a first time step. Optionally, the first time step is 2 nanoseconds (i.e. $T_1=T_1-2$ ns).

The second "experiment" is subsequently conducted. During the second experiment a gate driver waveform according to the updated values of the first time period, $T_1$, the second time period, $T_2$, and the third time period, $T_3$, is generated and applied to the gate of the Electrical Switch (ES) 103. The controller 103 observes the drain current, $i_D$, while applying the gate drive waveform (e.g. by sampling the drain current, $i_D$, using the current sensor 303). The method subsequently proceeds to step 406.

In step 406 the controller 301 measures the current overshoot, $I_{overshoot}$, in the drain current. The current overshoot, $I_{overshoot}$, is the difference between the maximum drain current, $i_D$, that is observed during a switching event and the steady state drain current (i.e. the value of the drain current, $i_D$, that is reached once the effects of switching (e.g. overshoot) are no longer present).

The current overshoot, $I_{overshoot}$, is determined by the controller 301 using the samples of the drain current, $i_D$, that were obtained when the gate driver waveform was applied to the Electrical Switch (ES) 103. FIG. 4B shows an example of the current overshoot that occurs during a switch (although it is noted that the switching waveform in FIG. 4B is from the first experiment (i.e. using the parameters in step 402) and not the second experiment (e.g. using the parameters in step 405)). The method proceeds to step 407 after measuring the current overshoot, $I_{overshoot}$, in the drain current, $i_D$.

In step 407 it is determined whether the current overshoot, $I_{overshoot}$, measured in step 406 is less than the threshold current, $I_{threshold}$ (initialised in step 402). Or in other words, it is determined whether $I_{overshoot} < I_{threshold}$. If the current overshoot, $I_{overshoot}$, is greater than the threshold current, $I_{threshold}$, the method proceeds to step 405.

In step 405 the value of the first time period, $T_1$, is reduced by a first step in preparation for a next "experiment". Optionally, the first step is 2 nanoseconds (i.e. $T_1=T_1-2$ ns). Values for a next "experiment" are subsequently determined. The next "experiment" uses the updated value of the first time period, $T_1$, and the previous value of the second time period $T_2$ (set in step 404). An updated value of the third time period, $T_3$, is also calculated for the next "experiment" using the updated value of the first time period, $T_1$, the previous value of the second time period $T_2$ (set in step 404).

A gate driver waveform generated according to the updated values of the first time period, $T_1$, and the third time period, $T_3$, is subsequently applied to the gate of the Electrical Switch (ES) 103 (e.g. by causing the Active Gate Driver 302 to generate an output current at: a high Gate current, $I_{G\_high}$, for the first time period, $T_1$; a low Gate current, $I_{G\_low}$, for the second time period, $T_2$, and a high Gate current, $I_{G\_high}$, for the third time period, $T_3$. The drain current, $i_D$, is sampled by the controller 301 during the switch event and the method proceeds to step 406.

In step 406 the current overshoot, $I_{overshoot}$, is determined from the drain current waveform measured during the switch event. After determining the current overshoot the method proceeds to step 407. As discussed above, in step 407 it is determined whether the current overshoot, $I_{overshoot}$, is less than the threshold current, $I_{threshold}$.

The method proceeds to step 405 if it is determined that the current overshoot, $I_{overshoot}$, in the drain current, $i_D$, during the switch is greater than or equal to the threshold current, $I_{threshold}$. The value of the first time period, $T_1$, of the gate driver waveform has a heavy influence on the current overshoot. Consequently, steps 405, 406 and 407 iterate the value of the first time period, $T_1$, until an optimum value for the current overshoot is obtained.

If it is determined in step 407 that the current overshoot, $I_{overshoot}$, is less than the threshold current, $I_{threshold}$, then the method proceeds to step 408. At this point a value of the first time period, $T_1$, which generates an optimum value for the current overshoot has been obtained.

In step 408 the time to overshoot, $t_{overshoot}$, is determined from the drain current waveform, $i_D$, sampled by the controller 301. The time to overshoot, $t_{overshoot}$, measured in step 408 is determined from the drain current waveform for the last experiment (e.g. using the drain current waveform that was generated for the most-recent values of the first time period, $T_1$, the second time period, $T_2$, and the third time period, $T_3$). As discussed in relation to step 403, the time to overshoot, $t_{overshoot}$, is the time difference between the start of applying the switching waveform to the Electrical Switch (ES) 103 and achieving observing a maximum drain current, $i_D$. After determining the time to overshoot, $t_{overshoot}$, the method proceeds to step 409.

In step 409, the value of the second time period, $T_2$, is calculated according to a difference between the time to overshoot, $t_{overshoot}$ and the value of the first time period, $T_1$, (i.e. $T_2=t_{overshoot}-T_1$). For the avoidance of doubt, it is emphasised that the value of the first time period, $T_1$, is the value of the first time period, $T_1$, most recently used that generated a drain current waveform that satisfied the evaluation in step 407. The value of the second time period, $T_2$, influences the switching loss and it has been found that $t_{overshoot}-T_1$ represents the optimum value with the lowest energy losses.

An updated value of the third time period, $T_3$, is calculated according to the value of the first time period, $T_1$, and the value of the second time period, $T_2$ (updated in step 409). After determining the optimum values of the first time period, $T_1$, the second time period, $T_2$, and the third time period, $T_3$, the method proceeds to step 410 where the method ends.

In an example, after the method of optimisation ends, the controller 301 is configured to switch the Electrical Switch (ES) 103 using a gate driving waveform characterised by the values of the first time period, $T_1$, the second time period, $T_2$, and the third time period, $T_3$, obtained from the method (in particular, the values of $T_1$, $T_2$, and $T_3$ from step 409).

The method described above in relation to FIG. 4A describes a method of optimising a 3-step gate current waveform (the 3-steps being time steps, i.e. $T_1$, $T_2$, and $T_3$). The 3-step gate driver signal shown in FIG. 3B can achieve both low ringing (i.e. low current overshoot) and low switching losses when optimised according to the above described method. Furthermore, the gate driver signal in the example of FIG. 3B is a low complexity signal, only requiring 2 different non-zero current levels (i.e. $I_{G\_high}$ and $I_{G\_low}$).

The method described above is discussed in relation to a 3-step gate current waveform (the 3-steps being time steps, i.e. $T_1$, $T_2$, and $T_3$). However it is emphasised that the above-described method could also be used with a 2-step gate current waveform. In this case, the method of FIG. 4A is adapted in step 402 so that $T_1$ equals a time period required to reach the total gate charge ($Q_g$). It will be appreciated that this still generates a gate driver waveform with high current level, $I_{G\_high}$, for the whole of the switching period. Furthermore, in the absence of a third time period, $T_3$, the value of the second time period, $T_2$, calculated in step 409 represents a minimum time period and, in an example, the time period is increased in order to reach the total gate charge ($Q_g$).

In the optimisation method discussed above, the drain current, $i_D$, is measured and fed back to the controller 301. As a result, the gate drive waveform can be adjusted for achieving optimum performance under different operating conditions (e.g. under different drain currents), thereby improving the flexibility of the active gate driver system. Finally, automatic optimization of the switching performance can be achieved using the algorithm discussed above. In particular, the performance of the switching transient can be improved with both lower loss and lower ringing.

In an example, the method of FIG. 4A (i.e. the method of optimising the gate driver waveform) is performed in response to receiving a request to perform the optimisation. In a further example the optimisation method is performed after a predetermined duration of time has elapsed since the last optimisation (thereby maintaining the effectiveness of the gate drive waveform despite changing environmental conditions).

As discussed above a conventional gate driver has no little or no control over the switching transient. As a result, high current overshoots can be experienced. Furthermore, controlling the switching speed using a constant gate resistor provides little flexibility and can result in higher switching losses. The systems and methods described above provide a low complexity waveform and an optimisation method that can optimise the current overshoot and the energy loss in a way that can be performed automatically (i.e. without the need to manually generate complex waveforms) and in a way that can adapt to changing conditions (e.g. changing drain currents).

In the example discussed above an output current waveform of the Electrical Switch (ES) is used by the optimisation method to optimise the gate driver waveform. Alternatively, or in addition, the optimisation method may use an output voltage waveform to optimise the gate driver waveform. For example, the output voltage, $v_{OUT}$, or equivalently in FIG. 3A, the drain-source voltage, $v_{DS}$, can be used by the optimisation method. In this case the output voltage waveform is sampled by a voltage sampler and these samples are provided to the controller 303 in order to generate the output voltage waveform. The optimisation method subsequently uses characteristics of the voltage waveform (e.g. a voltage overshoot) to optimise the gate driver waveform. In the case where the drain-source voltage, $v_{DS}$, is used then the method of FIG. 4A is adapted to use a threshold voltage threshold, $V_{threshold}$ (instead of a current threshold $I_{threshold}$) and a voltage undershoot, $V_{undershoot}$ (instead of a current overshoot, $I_{overshoot}$).

Figure 5:
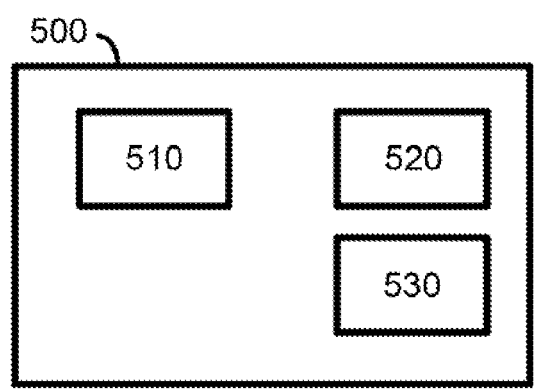
FIG. 5 shows an implementation of a controller according to an example.

FIG. 5 shows an implementation of a controller according to an example. The controller 500 comprises an input/output module 510, a processor 520 and a non-volatile memory 530. The input/output module 510 is configured to communicate with the Active Gate Driver 302 and the current sensor 303. For example, the input/output module 510 of the controller 500 is configured to receive sensor readings/measurements of the drain current, $i_D$, and transmit an input voltage, $v_{in}$, indicating an output state of the Active Gate Driver 302 (thereby generating a gate driver waveform). The processor 520 is coupled to the input/output module 510 and to the non-volatile memory 530. The non-volatile memory 530 stores computer program instructions that, when executed, cause the processor 520 to execute program steps that implement the functionality of a controller as described in the above-methods.

In an example, the non-volatile memory 530 stores computer program instructions that, when executed, cause the processor 520 to determine an optimum gate driver waveform as discussed in relation to FIG. 4A.

A number of use-cases exist for the above-described methods and systems. For example, Active Gate Driver (AGD) systems as described above could be used in electric vehicles, power tools, cooling systems, etc.

In the example above, the Electrical Switch (ES) 103 and the second Electrical Switch (ES) 308 is a MOSFET. However it is emphasized, for the avoidance of any doubt, that other electrical switches could be used instead including, but not limited to, an Insulated Gate Bipolar Transistor (IGBT).

While certain arrangements have been described, the arrangements have been presented by way of example only, and are not intended to limit the scope of protection. The inventive concepts described herein may be implemented in a variety of other forms. In addition, various omissions, substitutions and changes to the specific implementations described herein may be made without departing from the scope of protection defined in the following claims.

The invention claimed is:

1. A method for controlling an electrical switch using a driver waveform, wherein the driver waveform comprises:
   a first time period associated with a first current of the driver waveform;
   a second time period associated with a second current of the driver waveform: wherein:
      the first current of the driver waveform is larger than the second current of the driver waveform; and
      the first time period has a first duration and the second time period has a second duration;
   the method comprising:
      determining a modified first duration by modifying the first duration until an overshoot in an output waveform generated by switching the electrical switch using the driver waveform is less than a first predetermined value;
      determining a modified second duration based on the modified first duration and a time difference between a start of switching the electrical switch and a time at which a value above a second predetermined value of the output waveform is observed; and
      switching the electrical switch using the driver waveform, wherein the driver waveform includes the modified first duration and the modified second duration after modifying the first duration and the second duration.

2. The method according to claim 1, further comprising: setting the second duration equal to zero;
   applying the driver waveform to the electrical switch;
   determining a time to overshoot based on a time difference between:
      1) a time when the driver waveform is first applied to the electrical switch; and
      2) a time when overshoot above a third predetermined value in the output waveform associated with the electrical switch is observed;

setting the first duration equal to the time to overshoot; and setting the second duration equal to a turn-on time above a duration.

3. The method according to claim 1, wherein modifying the first duration comprises:
adjusting a value of the first duration;
switching the electrical switch using the driver waveform; and
measuring the overshoot in the output waveform generated by switching the electrical switch.

4. The method according to claim 3, wherein adjusting the value of the first duration comprises reducing the value of the first duration by a time step.

5. The method according to claim 1, wherein determining the modified second duration comprises:
determining a time to overshoot based on a difference between:
1) a time when the driver waveform is first applied to the electrical switch; and
2) a time when overshoot above a third predetermined value in the output waveform associated with the electrical switch is observed; and
generating the modified second duration based on a difference between the time to overshoot and the modified first duration.

6. The method according to claim 1, wherein the driver waveform further comprises:
a third time period associated with the first current of the driver waveform wherein the third time period has a third duration, and the method further comprises:
determining a modified third duration based on the modified first duration and the modified second duration; and
switching the electrical switch using the driver waveform wherein the driver waveform includes the modified third duration after modifying the third duration.

7. The method according to claim 6, wherein determining the modified third duration comprises:
calculating a first charge injected during the first time period;
calculating a second charge injected during the second time period; and
determining a remaining charge to be injected based on a difference between a total gate charge and a sum of: the first charge injected and the second charge injected.

8. The method according to claim 3, wherein the output waveform is a current waveform.

9. The method according to claim 8, wherein the electrical switch is a MOSFET.

10. The method according to claim 9, wherein the output waveform is a drain current waveform comprising information identifying a drain current of the MOSFET.

11. The method according to claim 8, wherein measuring the overshoot in the current waveform comprises:
measuring a current associated with the electrical switch while switching the electrical switch using the driver waveform;
determining a maximum value of the current;
determining a steady state value of the current; and
calculating the overshoot in the current waveform based on a difference between the maximum value of the current and the steady state value of the current.

12. A device for controlling an electrical switch using a driver waveform, wherein the driver waveform comprises:
a first time period associated with a first current of the driver waveform;
a second time period associated with a second current of the driver waveform; wherein:
the first current of the driver waveform is larger than the second current of the driver waveform; and
the first time period has a first duration and the second time period has a second duration;
the device comprising a controller configured to:
determine a modified first duration by modifying the first duration until an overshoot in an output waveform generated by switching the electrical switch using the driver waveform is less than a first predetermined value;
determine a modified second duration based on the modified first duration and a time difference between a start of switching the electrical switch and a time at which a value above a second predetermined value of the output waveform is observed; and
switch the electrical switch using the driver waveform, wherein the driver waveform includes the modified first duration and the modified second duration after modifying the first duration and the second duration.

13. The device according to claim 12, wherein the controller is further configured to:
set the second duration equal to zero;
determine a time to overshoot based on a time difference between:
1) a time when the driver waveform is first applied to the electrical switch; and
2) a time when overshoot above a third predetermined value in the output waveform associated with the electrical switch is observed:
set the first duration equal to the time to overshoot; and
set the second duration equal to a turn-on time above a duration.

14. The device according to claim 12, wherein the controller is further configured, when modifying the first duration, to:
adjust a value of the first duration;
switch the electrical switch using the driver waveform; and
measure the overshoot in the output waveform generated by switching the electrical switch.

15. The device according to claim 14, wherein the controller is further configured, when adjusting the value of the first duration, to: reduce the value of the first duration by a time step.

16. The device according to claim 12, wherein the controller is further configured, when determining the modified second duration, to:
determine a time to overshoot based on a difference between:
1) a time when the driver waveform is first applied to the electrical switch; and
2) a time when overshoot above a third predetermined value in the output waveform associated with the electrical switch is observed; and
generate the modified second duration based on a difference between the time to overshoot and the modified first duration.

17. The device according to claim 12, wherein the driver waveform further comprises:
a third time period, associated with the first current of the driver waveform wherein the third time period has a third duration, and
the controller is further configured to:
determine a modified third duration based on the modified first duration and the modified second duration; and switch the electrical switch using the driver waveform wherein the driver waveform includes the modified third duration after modifying the third duration.

18. The device according to claim 17, wherein the controller is further configured, when determining the modified third duration, to:
calculate a first charge injected during the first time period;
calculate a second charge injected during the second time period;
determine a remaining charge to be injected based on a difference between a total gate charge and a sum of: the first charge injected and the second charge injected; and
calculate the modified third duration based on the remaining charge to be injected divided by the first current.

19. The device according to claim 12, wherein the output waveform is a current waveform.

20. A non-transitory computer-readable medium comprising computer program instructions suitable for execution by a processor, the instructions configured, when executed by the processor, to:
control an electrical switch using a driver waveform, wherein the driver waveform comprises:
a first time period associated with a first current of the driver waveform;
a second time period associated with a second current of the driver waveform; wherein:
the first current of the driver waveform is larger than the second current of the driver waveform; and
the first time period has a first duration and the second time period has a second duration;
the instructions further configured, when executed by the processor to:
determine a modified first duration by modifying the first duration until an overshoot in an output waveform generated by switching the electrical switch using the driver waveform is less than a first predetermined value;
determine a modified second duration based on the modified first duration and a time difference between a start of switching the electrical switch and a time at which a value above a second predetermined value of the output waveform is observed; and
switch the electrical switch using the driver waveform, wherein the driver waveform includes the modified first duration and the modified second duration after modifying the first duration and the second duration.

* * * * *